United States Patent
Seckora

(10) Patent No.: US 7,064,278 B2
(45) Date of Patent: Jun. 20, 2006

(54) IMPEDANCE MATCHING CONNECTION SCHEME FOR HIGH FREQUENCY CIRCUITS

(76) Inventor: Michael C. Seckora, 2750 SW. 325th Ave., Hillsboro, OR (US) 97123

( * ) Notice: Subject to any disclaimer, the term of this patent is extended or adjusted under 35 U.S.C. 154(b) by 518 days.

(21) Appl. No.: 10/106,977

(22) Filed: Mar. 25, 2002

(65) Prior Publication Data

US 2003/0177637 A1 Sep. 25, 2003

(51) Int. Cl.
*H05K 1/16* (2006.01)
(52) U.S. Cl. .................. 174/260; 174/261; 361/774; 361/777
(58) Field of Classification Search ............... 174/260, 174/261; 361/780, 768, 777–779, 772–776
See application file for complete search history.

(56) References Cited

U.S. PATENT DOCUMENTS

| | | | | |
|---|---|---|---|---|
| 4,883,920 A | * | 11/1989 | Tanabe et al. | 174/263 |
| 6,121,554 A | * | 9/2000 | Kamikawa | 174/260 |
| 6,353,540 B1 | * | 3/2002 | Akiba et al. | 361/794 |
| 6,765,805 B1 | * | 7/2004 | Naruse et al. | 361/803 |
| 2003/0218923 A1 | * | 11/2003 | Giaretta et al. | 365/200 |

* cited by examiner

*Primary Examiner*—Kamand Cuneo
*Assistant Examiner*—Jeremy Norris
(74) *Attorney, Agent, or Firm*—Berkeley Law and Technology Group, LLC

(57) ABSTRACT

Methods and apparatus provide for electrical coupling of electrical components to traces on a substrate such that impedance mismatches otherwise experienced in high frequency operation are avoided. Connecting elements having length, width, and thickness, are provided for terminals of a component to be connected to a trace. The connecting element is electrically coupled between the terminal and the trace, typically by soldering. The dimensions of the connecting element are chosen to reduce or eliminate the impedance mismatch which would result from a direct connection between the trace and component. Connecting elements are generally L-shaped, i.e., having first and second planar portions perpendicular with respect to each other, and having a curving portion that connects the first and second planar portions. In one embodiment, dimensions of at least a portion of the connecting element are such that its width increases as its distance from a ground plane within the substrate increases.

6 Claims, 5 Drawing Sheets

IMPEDANCE MATCHING CONNECTION SCHEME FOR HIGH FREQUENCY CIRCUITS

BACKGROUND OF THE INVENTION

1. Field of the Invention

The present invention relates generally to impedance matching in the construction of high frequency circuits, and more particularly relates to connection schemes for reducing impedance mismatches between conductive traces and components coupled thereto.

2. Background Information

With advances in integrated circuit, microprocessor, networking and communication technologies, an increasing number of devices, in particular, digital computing devices, are being networked together. Such devices are often first coupled to a local area network, such as an Ethernet-based office/home network. In turn, the local area networks are interconnected together through wide area networks, such as Synchronous Optical Networks (SONET), Asynchronous Transfer Mode (ATM) networks, Frame Relays, and the like. Of particular importance is the TCP/IP based global inter-network, the Internet. The rapid growth of the Internet has fueled a convergence of data communication (datacom) and telecommunication (telecom) protocols and requirements. It is increasingly important that data traffic be carried efficiently across local, regional and wide area networks.

As a result of this trend of increased connectivity, an increasing number of applications that are network dependent are being deployed. Examples of these network dependent applications include, but are not limited to, the World Wide Web; email, Internet-based telephony, and various types of e-commerce and enterprise applications. The success of many content/service providers as well as commerce sites depends on high-speed delivery of a large volume of data across wide areas. In turn, this trend leads to an increased demand for high-speed data trafficking equipment, such as high-speed optical-electrical routers or switches and the like. In other words, as a widening variety of new and traditional services converge across shared inter-networking transport structures, there is a critical need for the Internet to simultaneously deliver higher bandwidths, more reliable service, and greater deployment flexibility.

The widespread deployment of high-speed networking and communications equipment has produced a large demand for various types of networking and communications components and subsystems. Included among these, are modules which are often referred to as optical transponders.

Optical transponders typically include components for both electrical signal processing, and components for transmission and reception of optical signals. Conventional optical transponders typically receive electrical signals in parallel, serialize the data represented by these signals, convert the serialized data into a light-based signal, and couple that signal to an outbound optical fiber. Similarly, conventional optical transponders, typically receive a serialized light-based data stream, convert that data stream to an electrical equivalent, de-serialize that data, and provide the de-serialized electrical data, i.e., data in a parallel format, to a plurality of output terminals. A common characteristic of optical transponders, and many other modern electronic circuits and systems, is that such equipment operates with signals having high frequencies, such as those in the GHz range and above.

Unfortunately, at very high frequencies, the performance, or operational characteristics, of electronic circuits and systems, including but not limited to products such as optical transponders, is limited by impedance mismatches that exist within those electronic circuits and systems. In some instances, impedance mismatches occur between conductive traces and various components which make electrical contact with those traces.

What is needed are methods and apparatus for constructing high frequency circuits with reduced impedance mismatches between components and the conductive traces to which those components are coupled.

SUMMARY OF THE INVENTION

Briefly, methods and apparatus provide for electrical coupling of electrical components to traces on a substrate such that impedance mismatches otherwise experienced during high frequency operation are reduced or eliminated.

A connecting element having a length, width, and thickness, is provided for each terminal of an electrical component that is to be electrically connected to a trace, and the connection strip is electrically coupled between the component terminal and the trace, typically by soldering. The dimensions of the connecting element are chosen so as to reduce or eliminate the impedance mismatch which would result from a direct connection between the trace and the component terminal. Connecting elements are generally L-shaped, i.e., having first and second planar portions perpendicular with respect to each other, and having a curving portion that connects the first and second planar portions. In one embodiment, the dimensions of at least a portion of the connecting element are such that its width increases as its distance from a ground plane within the substrate increases.

BRIEF DESCRIPTION OF THE DRAWINGS

The present invention will be described by way of exemplary embodiments, illustrated in the accompanying drawings in which like references denote similar elements.

DETAILED DESCRIPTION OF THE INVENTION

In the following description, various aspects of the present invention will be described. However, it will be apparent to those skilled in the art that the present invention may be practiced with only some, or with all of the aspects disclosed herein. For purposes of explanation, specific numbers, materials, and configurations are set forth in order to provide a thorough understanding of the present invention. However, it will also be apparent to one skilled in the art and having the benefit of this disclosure, that the present invention may be practiced without those specific details. In other instances, well-known features are omitted or simplified in order not to obscure the present invention.

Reference herein to "one embodiment", "an embodiment", or similar formulations, means that a particular feature, structure, or characteristic described in connection with the embodiment, is included in at least one embodiment of the present invention. Thus, the appearance of such phrases or formulations herein are not necessarily all referring to the same embodiment. Furthermore, various particular features, structures, or characteristics may be combined in any suitable manner in one or more embodiments.

In many instances, the assembly of electronic products and systems, includes attaching and electrically coupling various electrical components to a substrate. More particularly, components, such as for example, high frequency capacitors, have terminals adapted to be placed over conductive traces on a substrate, and to be electrically coupled thereto, typically by soldering. However, in electronic systems in which transmission line characteristics are relevant considerations, the impedance mismatch, which results, at least in part, from the difference in resistance between the relatively wide solder pad of a component terminal and the relatively narrow trace, limits the overall high frequency performance of such systems.

Figure 1:
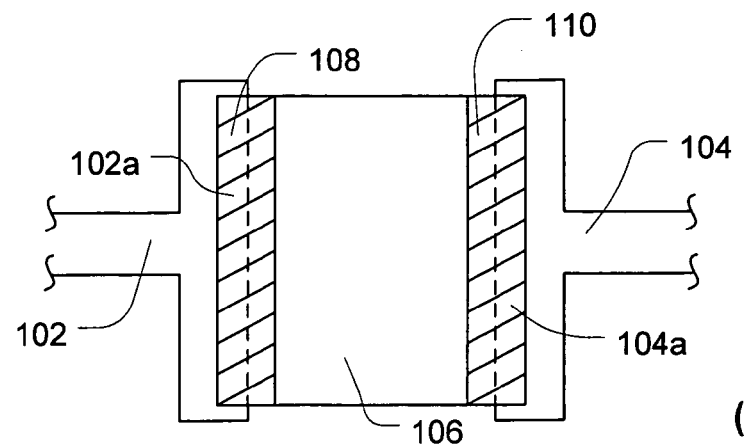
FIG. 1 is a top view of a low-profile surface-mount capacitor having two terminals, each terminal electrically connected, in accordance with the prior art, to an electrically conductive trace on a substrate.

FIG. 1 is a top view of a low-profile surface-mount capacitor having two terminals, each terminal electrically coupled by way of solder pads, in accordance with the prior art, to an electrically conductive trace on a substrate. More particularly, traces 102 and 104, typically comprising copper, are disposed on an electrically insulating substrate (not shown). Such substrates may be simple single-sided boards, that is, having traces on one surface thereof, or may be more complex with conductive materials, disposed within to act as signal pathways, ground planes, or both. A capacitor 106 (a two terminal electrical component) is disposed over, and electrically connected to portions of traces 102, 104. Portion 102a of trace 102, which underlies connection region 108, is shown in dashed lines, and portion 104a of trace 104, which underlies connection region 110, is also shown in dashed lines in FIG. 1. Capacitor 106 has a first connection region 108 and a second connection region 110. Connection regions 108, 110, are electrically conductive and each provides an electrical pathway to a respective one of the capacitor's two terminals. There is a difference in impedance, i.e., a mismatch, between traces 102, 104 and connection regions 108, 110 respectively, because of the difference in the physical dimensions of these electrically conductive regions.

Figure 2:
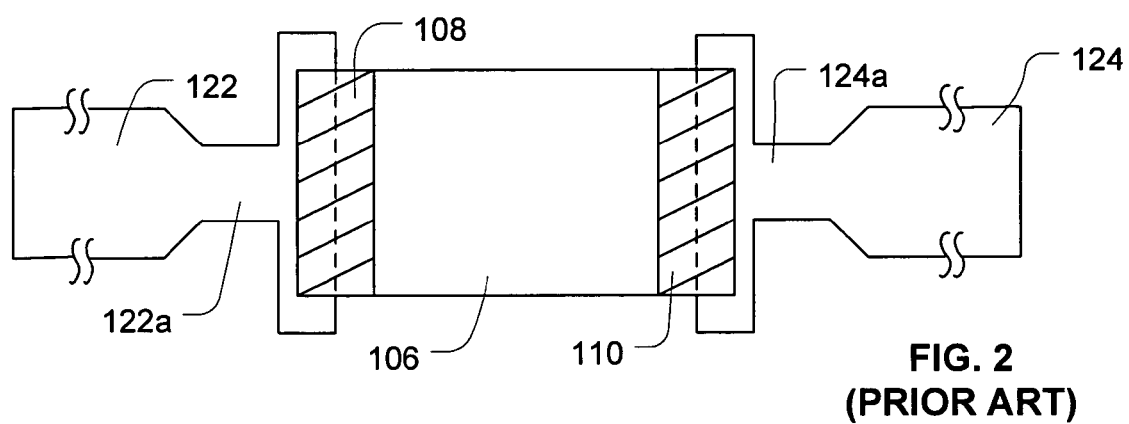
FIG. 2 is a top view of a low-profile surface-mount capacitor having two terminals, each terminal electrically connected, in accordance with the prior art, to an electrically conductive trace that has been narrowed in the neighborhood of the connection with the capacitor in order to increase the resistance of the trace to compensate for the reduced resistance of the relatively wide solder pad, i.e., conductive portion of the terminal.

FIG. 2 is a top view of a low-profile surface-mount capacitor having two terminals, each terminal electrically coupled by way of solder pads, in accordance with the prior art, to an electrically conductive trace that has been narrowed in the neighborhood of the connection with the capacitor in order to increase the impedance of the trace to compensate for the reduced impedance of the relatively wide solder pad. More particularly, traces 122 and 124, typically comprising copper, are disposed on an electrically insulating substrate (not shown). A capacitor 106 is disposed over, and electrically connected, typically by soldering, to portions of traces 122, 124. Portion 122a of trace 122, is tapered, or narrowed, as it approaches connection region 108 of capacitor 106 so that, taken together, the increased impedance of the trace and the decreased impedance of the solder pad, an effective impedance that is approximately equal to the impedance of the untapered portion of trace 122 is achieved. Similarly, portion 124a of trace 124, is tapered, or narrowed as it approaches connection region 110 so that between the increased impedance of the tapered portion of the trace and the decreased impedance of the solder pad, an effective impedance that is approximately equal to the impedance of the trace is achieved.

While tapering the traces in accordance with the prior art is somewhat effective in reducing impedance mismatches, it increases the mismatch between the connection and component, and signal quality is compromised. An additional disadvantage of this prior art approach is that the tapering of traces must be precisely tuned to a particular set of component specifications associated with the component that will be connected to that tapered trace. In other words, manufacturing flexibility is reduced because once substrates with tapered traces are manufactured, it is generally cost prohibitive to rework these substrates to accommodate components with different physical characteristics that will not properly fit with the impedance tuning of the previously tapered traces.

As will be seen below in connection with description of various illustrative embodiments of the present invention, manufacturing flexibility is maintained by not tapering traces, while at the same time reduction of impedance mismatches between traces and components is achieved.

Illustrative Structures

To achieve the desired high frequency performance, or operating characteristics, in electronic circuits and systems that operate with signals in the GHz range and above (and particularly above 10 GHz), it is desirable to reduce impedance mismatches that occur between conductive traces and electrical components coupled thereto.

Figure 3:
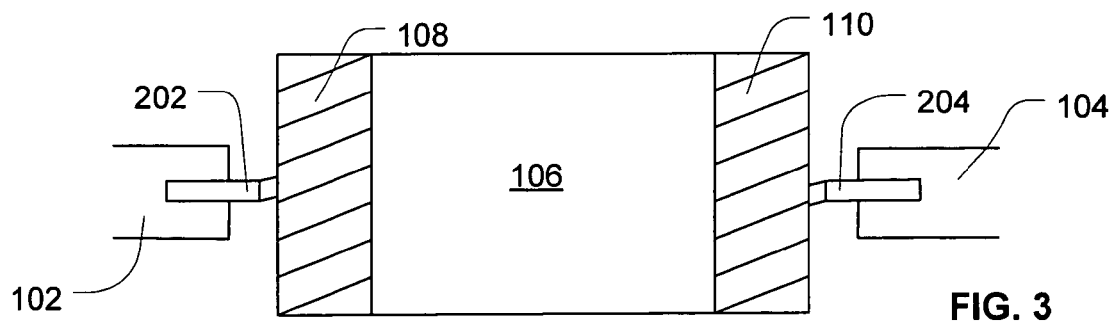
FIG. 3 is a top view of a low-profile surface-mount capacitor having two terminals, each terminal electrically connected to an electrically conductive trace on a substrate by way of a connecting element in accordance with the present invention.

FIG. 3 is a top view of a low-profile surface-mount capacitor having two terminals, each terminal electrically connected to an electrically conductive trace on a substrate by way of a connecting element in accordance with the present invention. Traces 102 and 104 are disposed on an electrically insulating substrate (not shown). A capacitor 106 is also disposed on the substrate. In some embodiments the capacitor is attached to the substrate by way of an adhesive, such as for example, an epoxy adhesive, disposed between capacitor 106 and the substrate. Capacitor 106 has a first connection region 108 and a second connection region 110. Connection regions 108, 110 provide electrically conductive pathways by which connection with the terminals of the capacitor are achieved. In some embodiments, connection regions 108, 110 are tinned so as to be ready for a soldering operation. In accordance with the present invention, a connecting element 202 provides an electrical pathway between trace 102 and connection region 108. Similarly, in this illustrative embodiment, a connecting element 204 provides an electrical pathway between trace 104 and connection region 110. Connecting element 202 is typically soldered to trace 102 and to connection region 108; and, similarly, connecting element 204 is typically soldered to trace 104 and connection region 110.

Still referring to FIG. 3, connecting element 202 is a continuous piece of conductive material, such as but not limited to copper. Connecting element 202 has a first substantially planar portion that is attached to trace 102, a second substantially planar portion that is attached to connection region 108, and an upwardly curving portion extending from trace 102 to connection region 108. It will be noted from the figure that the width of trace 102 is less than that of connection region 108. The materials comprising trace 102 and connection region 108, and the thicknesses of trace 102 and connection region 108 are such that there is an impedance mismatch between trace 102 and connection region 108 at high frequencies, such as for example, 10 GHz and above. This impedance mismatch results, at least in part, from the resistance of connection region 108 being less than that of trace 102. As shown in FIG. 3, the width of connecting element 202 is less than that of trace 102, and connecting element 202 has a greater resistance than does trace 102. In this way, the increased resistance of connecting element 202, in combination with the resistance of connection region 108 (which is less than that of trace 102) effectively provides a reduced impedance mismatch.

The curving portion is referred to as being upwardly curving from the conventional point of view that the substrate is oriented as a base platform and components such as capacitor 106 reside "above" the substrate. It will be appreciated that this sense of direction is provided for convenience of description, and further appreciated that the absolute orientation of the substrate and components attached thereto is not an element of the present invention. The curving portion of connecting element 202 has a shape that may be described as a conic section. Sharp bends, such as for example a 90 degree angle should not be used. A particular equation which defines the curve traversed by the curved portion is a matter for the specific design.

Still referring to FIG. 3, connecting element 204 is, within manufacturing tolerances, identical to connecting element 202. As can be seen in the figure, connecting element 204 provides the electrical pathway between connection region 110 and trace 104.

Figure 4:
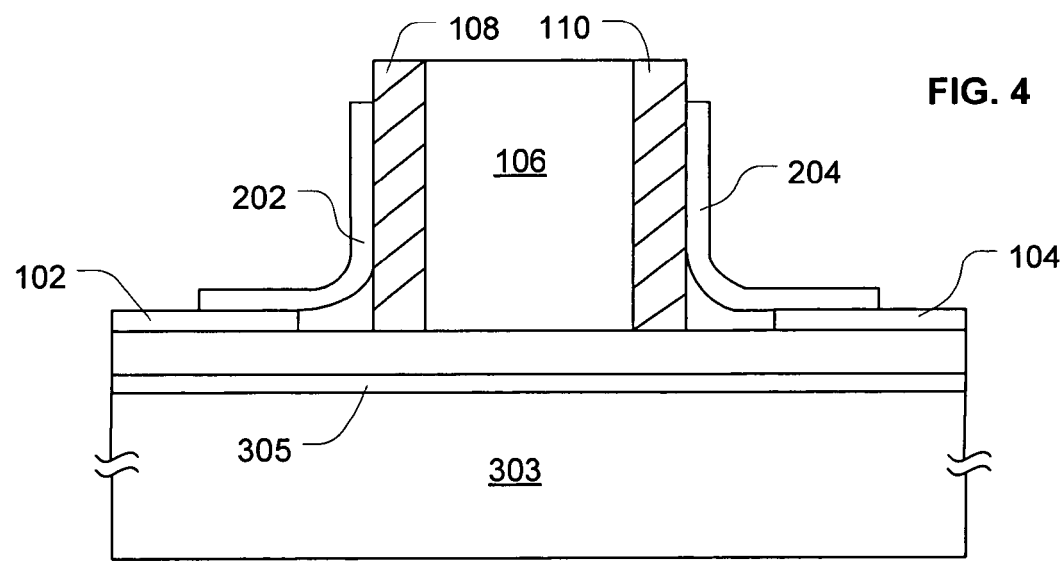
FIG. 4 is a side view of the structure of FIG. 3, wherein the low-profile surface-mount capacitor has two terminals, each terminal electrically connected to an electrically conductive trace on the substrate by way of connecting elements in accordance with the present invention.

FIG. 4 is a side view of the structure of FIG. 3, wherein the low-profile surface-mount capacitor has two terminals, each terminal electrically connected to an electrically conductive trace on the substrate by way of connecting elements in accordance with the present invention. As shown in the figure, a substrate 303 has traces 102, 104, and capacitor 106 disposed thereon. Capacitor 106 is disposed on substrate 303 such that it is between traces 102, 104. More particularly, this side view provides a clearer view of the curving portion of connecting elements 202 and 204.

Still referring to FIG. 4, it can be seen that disposed within substrate 303, there is a layer 305. Layer 305 is typically formed from a conductive material such as, but not limited to, copper. In operation, layer 305 is often coupled to a node such as, but not limited to, ground. In electronic products or systems where layer 305 is electrically coupled to a ground node, layer 305 is referred to as a ground plane. In some embodiments of the present invention, traces have underlying ground planes.

Figure 5:
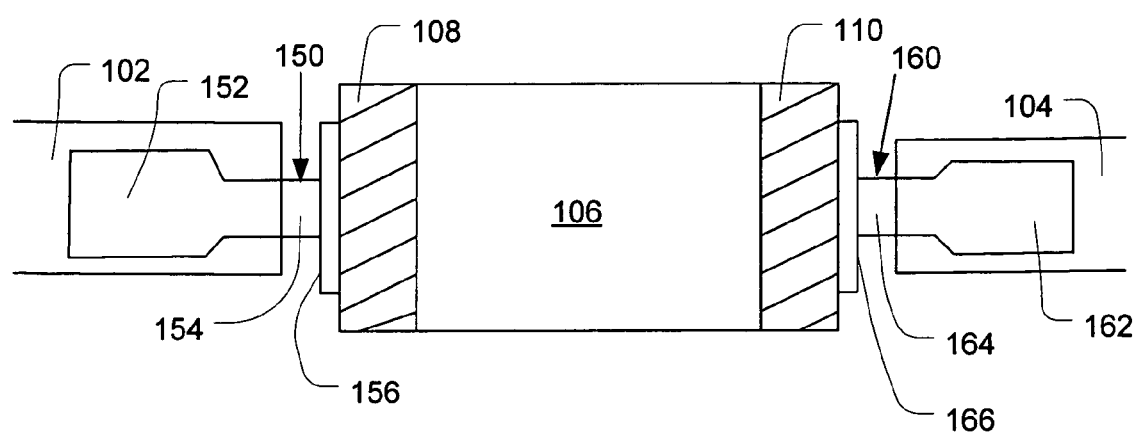
FIG. 5 is a top view of a low-profile surface-mount capacitor having two terminals, each terminal electrically connected to an electrically conductive trace on a substrate by way of an alternative connecting element in accordance with the present invention.

FIG. 5 is a top view of a low-profile surface-mount capacitor having two terminals, each terminal electrically connected to an electrically conductive trace on a substrate by way of alternative connecting elements in accordance with the present invention. Similar to the configuration shown in FIG. 3, traces 102 and 104 are disposed on a substrate, and capacitor 106, which has a first connection region 108 and a second connection region 110, is disposed on the substrate such that it is between traces 102 and 104. A connecting element 150 provides an electrical pathway from trace 102 to connection region 108. Connecting element 150 is similar to connecting element 202 of FIG. 3, except that connecting element 150 has a first substantially planar portion 152 that is wider than an intermediate portion 154. Intermediate portion 154 provides the impedance matching (i.e., reduction of impedance mismatch) functionality of connecting element 150. Portion 152, which is wider than the corresponding portion of connecting element 202, is adapted to provide additional area for forming a satisfactory electrical connection between trace 102 and connecting element 150, typically by soldering. In some embodiments, a second substantially planar portion 156 may also be wider than a corresponding portion of connecting element 202. Making second substantially planar portion 156 wider facilitates making a satisfactory electrical connection between connecting element 150 and connection region 108.

Still referring to FIG. 5, a connecting element 160, which provides an electrical connection between trace 104 and connection region 110, is shown. The shape of connecting element 160 is, to within the limits of manufacturing tolerances, identical to that of connecting element 150. As shown in the figure, connecting elements 150, 160 are aligned co-linearly. That is, they are aligned such that a common axis runs through their centerlines, as well as the centerline of capacitor 106. It will be appreciated that this alignment is achieved within the limits of manufacturing tolerances. In other words, perfect co-linearity of alignment may not be achieved, but such alignment within tolerances of any given manufacturing process may be referred to as co-linear for convenience of description. It will also be appreciated connecting elements 150, 160, may be intentionally aligned such that they are not co-linear. The present invention contemplates both the co-linear and non-co-linear alignments.

Figure 6A:
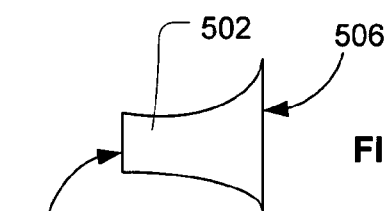
FIG. 6A is a top view illustrating a further alternative connecting element in accordance with the present invention which is useful for compensating for the change in capacitance between a ground plane in the substrate and the connecting element as the connecting element rises upwardly away from the surface of the substrate to make contact with a surface mount-electrical component.
Figure 6B:
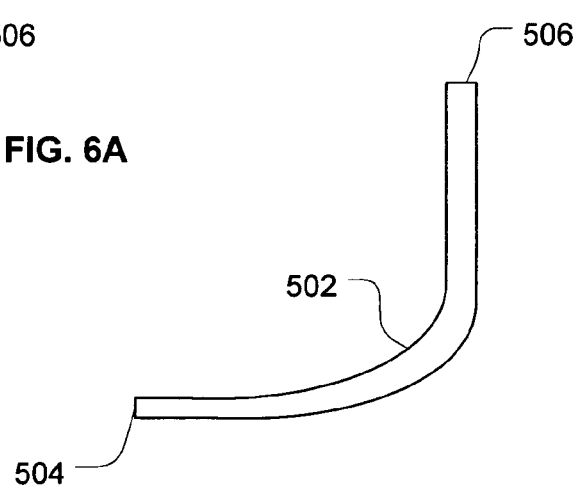
FIG. 6B is a side view of the connecting element of FIG. 6A.

FIGS. 6A and 6B illustrate a further alternative connecting element, in accordance with the present invention, which is useful for compensating for the change in capacitance between a ground plane in the substrate and the connecting element as the connecting element rises upwardly away from the surface of the substrate to make contact with a surface-mount electrical component. It is noted that the capacitance between two electrical nodes is a function of the distance between those nodes, and the dielectric constant of the material disposed between those nodes. Referring again, briefly, to FIG. 4, it can be seen that connecting elements 202, 204 move away from substrate 303 (and away from ground plane 305), in order to complete the electrical pathway between traces 102, 104, and connection regions 108, 110 of capacitor 106. As the distance between a connection element and the underlying ground plane increases, the capacitance between them decreases. Therefore the capacitance between trace and ground plane is different than the capacitance between connecting element and ground plane. This difference in capacitance results in an impedance mismatch between a trace and a corresponding connecting element.

Referring now to FIGS. 6A and 6B, an alternative connecting element 502 in accordance with the present invention is illustrated, which, by virtue of its physical shape, mitigates the impedance mismatch described above, by reducing the difference between the capacitance between trace and ground plane, and the capacitance between connecting element and ground plane. Connecting element 502 has a first end 504, adapted for connection with a trace, and a second end 506 adapted for connection with a component, such as, but not limited, to a capacitor. This reduction in capacitance is achieved by increasing the width of connecting element 502 along its path from the substrate to the capacitor. By making connecting element 502 wider as it moves away from the ground plane the change in capacitance per unit length (between the trace/ground plane capacitor and the connecting element/ground plane capacitor) is reduced because the area has been increased along the path of the connecting element. It will be appreciated by those skilled in the art and having the benefit of this disclosure that the amount of width increase per unit length of the connecting element is a function of the curvature (or bend radius in some embodiments) of the connecting element. It is noted that in some embodiments, the connecting element may be thinned as it is widened so as not to undesirably reduce the resistance of the connecting element as it is widened.

Figure 7:
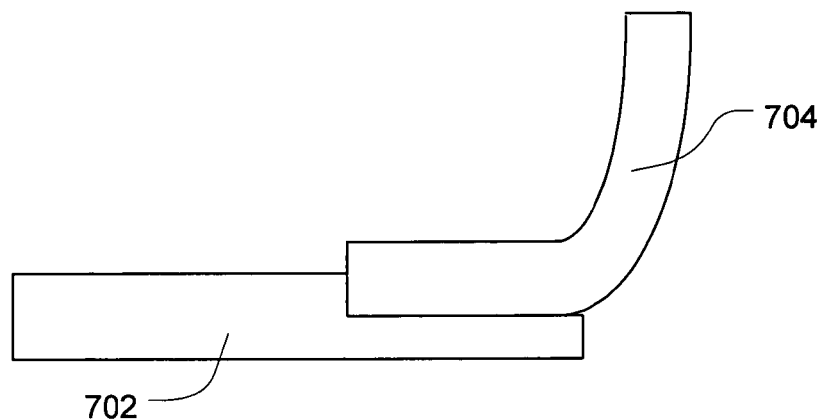
FIG. 7 is a side view of an alternative embodiment of the present invention in which the connecting element is attached to a notched portion of a trace.

FIG. 7 is a side view of an alternative embodiment of the present invention in which the connecting element is attached to a notched portion of a trace. In this illustrative embodiment, the reduction of the impedance mismatch between trace and component is still achieved with the aid of a portion of the connecting element that is reduced in width, reduced in electrically conductive cross-sectional area, or otherwise provided with increased resistivity per unit length. However, as can be seen, trace 702 has a notched portion into which connecting element 704 is positioned for mechanical and electrical connection, typically by soldering. It will be apparent to those skilled in the art and having the benefit of this disclosure that alternative forms of physical interface between a connecting element and a trace may be used. For example, the connecting element may be disposed on the substrate in the same plane as the trace, and it may abut the trace or have electrically conducting material disposed between it and the trace.

Illustrative Methods

Figure 8:
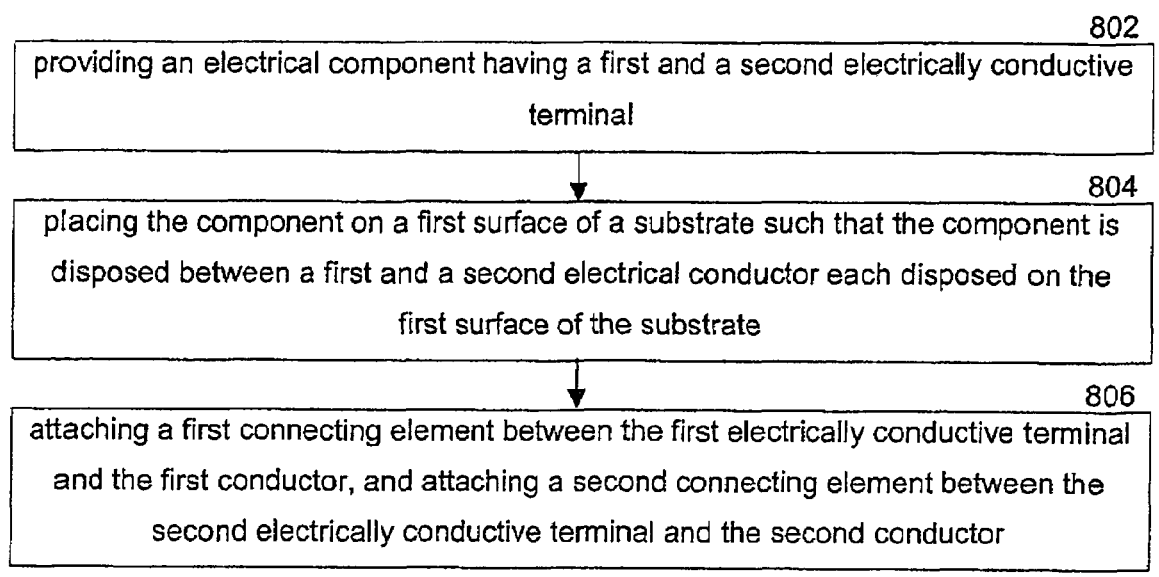
FIG. 8 is a flow diagram of a process in accordance with the present invention.

Referring to FIG. 8, a method of constructing a high frequency circuit, in accordance with the present invention includes providing 802 an electrical component having a first and a second electrically conductive terminal. Such electrical components include, but are not limited to low-profile surface-mount resistors and capacitors. The terminals of these electrical components typically have dimensions that are greater than those of the traces to which they will be electrically coupled. Commonly these terminals will be "tinned" or otherwise prepared for being soldered to form an electrical connection thereto. It will be appreciated that, although two-terminal electrical components are described in this illustrative example of the present invention, the invention is not limited to electrical components having two terminals. The component is then placed 804 on a first surface of a substrate such that the component is disposed between a first electrical conductor (e.g., a trace) and a second electrical conductor (e.g., a trace), each of the electrical conductors being disposed on the first surface of the substrate. The substrate is typically a printed circuit board, but is not so limited. This illustrative embodiment further includes attaching 806 a first connecting element between the first electrically conductive terminal and the first conductor, and attaching a second connecting element between the second electrically conductive terminal and the second conductor. In this illustrative embodiment the first connecting element is generally L-shaped, and has a width which is less than a width of the first conductor, and which is also less than a width of the first electrically conductive terminal. The connecting elements, may be referred to connection strips, and they are typically formed from metal strips such as, but not limited to, copper strips. In an exemplary application of the illustrative method, attaching the connecting elements is typically accomplished by soldering them to the traces and terminals.

Figure 9:
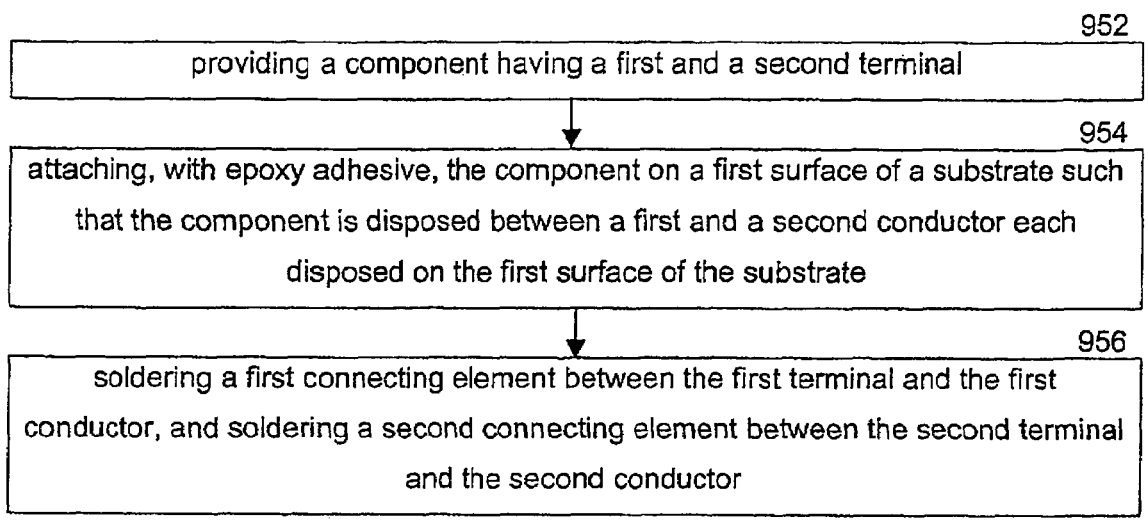
FIG. 9 is a flow diagram of another process in accordance with the present invention.

Referring to FIG. 9, a method of constructing a circuit, includes providing 952 a component having a first connection region and a second connection region. The component is typically a low-profile surface-mount type of component such as, but not limited to, a high frequency capacitor or a resistor. The component is then attached 954 to a first surface of a substrate with an epoxy adhesive such that the component is disposed between a first and a second conductor. The conductors are commonly referred to as traces, each trace is disposed on the first surface of the substrate, and the traces are typically formed from a metal such as, but not limited to copper. The substrate may be any suitable supporting material, but is typically an electrically non-conductive material such as, but not limited to, materials used to manufacture printed circuit boards. The process illustrated in FIG. 9 further includes soldering 956 a first connecting element between the first connection region and the first conductor, and soldering a second connecting element between the second connection region and the second conductor. In this illustrative embodiment of the present invention, the first connecting element is generally L-shaped, and has a resistance per unit length, over at least a portion thereof, which is greater than the resistance per unit length of the trace to which it is electrically coupled. In this illustrative embodiment, the greater resistance per unit length of the connecting element is achieved by making the connecting element have, over at least a portion of its length, a width which is less than a width of the first conductor. Further, the width of the connecting element is also typically less than a width of the first connection region.

With respect to the illustrative methods set forth above in connection with FIGS. 8 and 9, it is noted that the connecting elements are typically made from copper but other conductive materials, or combinations of materials may be used. In some embodiments, a connecting element may include varying concentrations of different materials along its length as one means of varying its resistance per unit length. Further, with respect to the connecting element being generally L-shaped, it is noted that these typically include first and second planar portions which are perpendicularly oriented to each other. It is noted that terms such as planar, when used herein, are given their common meaning within the industry, that is to say, substantially planar, or planar with the manufacturing tolerances of a given manufacturing process.

CONCLUSION

Thus, it can be seen from the above descriptions that methods and apparatus for reducing impedance mismatches in high frequency circuits have been described.

One advantage of various embodiments of the present invention is a reduction in the magnitude of impedance mismatches which would otherwise result from connection of relatively wide component solder pads to relatively narrow traces.

Other advantages of various embodiments of the present invention include greater flexibility for managing inventory, and matching a variety of electrical components to traces on a substrate by selecting an appropriately sized connecting element.

While the present invention has been described in terms of the above-described embodiments, those skilled in the art will recognize that the invention is not limited to the embodiments described. For example, rather than providing a connecting element with a narrowed width, a connecting element may be provided, which achieves substantially or identically the same results, by thinning one or more portions of the connecting element such that the conductive cross-sectional area is tuned to provide the desired resistance per unit length. Another example is that components such as, but not limited to, inductors, diodes, and transistors, in addition to the resistors and capacitors described earlier herein, may be used in connection with various embodiments of the present invention. The present invention can be practiced with modification or alteration within the spirit and scope of the subjoined claims. Thus, the description herein is to be regarded as illustrative rather than restrictive with respect to the present invention.

It is to be understood that the present invention is not limited to the embodiments described above, but encompasses any and all embodiments within the scope of the subjoined Claims.

The invention claimed is:

1. An electrical apparatus, comprising:
   an electrically insulating substrate;
   a first trace and a second trace, each disposed on a surface of the substrate, the first trace and the second trace being spaced apart from one another;
   a first conductive region disposed within the substrate such that the first conductive region underlies at least a portion of the first trace and at least a portion of the second trace;
   an electrical component overlying the substrate, disposed between the first trace and the second trace, the electrical component including a first connection region and a second connection region; and
   a first connecting element electrically coupled between the first trace and the first connection region of the electrical component;
   wherein each of the first trace, the first connecting element, and the second trace, has a resistance per unit length; and the resistance per unit length of at least a portion of the first connecting element is greater than the resistance per unit length of at least a portion of the first trace, said portion of the first connecting element lying within the electrical path between the first trace and the first connection region of the electrical component;
   wherein the first connecting element comprises a continuous piece of electrically conductive material that has a first substantially planar portion, an upwardly extending curving portion, and a second substantially planar portion; wherein the first substantially planar portion and the second substantially planar portion are substantially perpendicular to each other, and the upwardly extending curving portion has a radius of curvature;
   wherein the upwardly extending curving portion of the first connecting element has a width which varies across its length approximately in proportion to the distance between the first conductive regions and the first connecting element.

2. The electrical apparatus of claim 1, further comprising an adhesive disposed between the substrate and the electrical component; and solder disposed in at least a portion of a region defined by an overlap of the first trace and the first connecting element.

3. The electrical apparatus of claim 1, further comprising a first amount of solder disposed in at least a portion of a region defined by an overlap of the first trace and the first connecting element; and a second amount of solder disposed in at least a portion of a region defined by an overlap of the first connecting element and the first connection region.

4. An electrical apparatus, comprising:
   an electrically insulating substrate;
   a first trace and a second trace, each disposed on a surface of the substrate, the first trace and the second trace being spaced apart from one another;
   a first conductive region disposed within the substrate such that the first conductive region underlies at least a portion of the first trace and at least a portion of the second trace;
   an electrical component overlying the substrate, disposed between the first trace and the second trace, the electrical component including a first connection region and a second connection region; and
   a first connecting element electrically coupled between the first trace and the first connection region of the electrical component;
   wherein each of the first trace, the first connecting element, and the second trace, has a resistance per unit length; and the resistance per unit length of at least a portion of the first connecting element is greater than the resistance per unit length of at least a portion of the first trace, said portion of the first connecting element lying within the electrical path between the first trace and the first connection region of the electrical component;
   wherein the first connecting element comprises a continuous piece of electrically conductive material that has a first substantially planar portion, an upwardly extending curving portion, and a second substantially planar portion; wherein the first substantially planar portion and the second substantially planar portion are substantially perpendicular to each other, and the upwardly extending curving portion has a radius of curvature;
   wherein the upwardly extending curving portion of the first connecting element has a width which varies across its length such that a capacitance between the first connecting element and the first conductive region remains substantially constant across the length of the upwardly extending curving portion.

5. The electrical apparatus of claim 4, wherein the capacitance is approximately equal to the capacitance between the first trace and the first conductive region.

6. The electrical apparatus of claim 4, wherein the upwardly extending curving portion of the first connecting element has a thickness which becomes thinner as its width becomes wider.

* * * * *